(12) United States Patent
Lakin

(10) Patent No.: US 7,159,053 B1
(45) Date of Patent: Jan. 2, 2007

(54) PORTABLE FLAT DISPLAY ADAPTOR

(76) Inventor: Douglas Lakin, 9981 Basswood Ct., Ventura, CA (US) 93004

( * ) Notice: Subject to any disclaimer, the term of this patent is extended or adjusted under 35 U.S.C. 154(b) by 308 days.

(21) Appl. No.: 10/962,219

(22) Filed: Oct. 8, 2004

Related U.S. Application Data

(60) Provisional application No. 60/510,296, filed on Oct. 10, 2003.

(51) Int. Cl.
*G06F 13/00* (2006.01)
*H05K 7/00* (2006.01)

(52) U.S. Cl. .......................... 710/62; 710/72; 710/300; 361/681

(58) Field of Classification Search ............ 710/62–63, 710/72–74, 300–303; 361/681–682; 708/141; 345/501
See application file for complete search history.

(56) References Cited

U.S. PATENT DOCUMENTS

| 5,133,076 | A  |   | 7/1992  | Hawkins |              |
|-----------|----|---|---------|---------|--------------|
| 5,491,609 | A  |   | 2/1996  | Dankman |              |
| 5,768,541 | A  | * | 6/1998  | Pan-Ratzlaff | ........... 710/304 |
| 6,029,183 | A  |   | 2/2000  | Jenkins |              |
| 6,188,407 | B1 | * | 2/2001  | Smith et al. | ............. 715/841 |
| 6,299,464 | B1 | * | 10/2001 | Chen | ................. 439/131 |
| 6,421,232 | B1 |   | 7/2002  | Sallam  |              |
| 6,560,094 | B1 |   | 5/2003  | Schmidt |              |
| 6,571,342 | B1 |   | 5/2003  | Detlef  |              |
| 6,864,891 | B1 | * | 3/2005  | Myers | ................. 345/502 |
| 2002/0001032 | A1 | * | 1/2002 | Ohki | ................... 348/207 |
| 2004/0104905 | A1 | * | 6/2004 | Chung et al. | ........... 345/204 |

FOREIGN PATENT DOCUMENTS

| DE | 10113870 A1 | 9/2002 |
| EP | 1244000 A2  | 9/2002 |
| GB | 2213617 A * | 8/1989 |

OTHER PUBLICATIONS

Mounting Bracket Installation Instructions, p. 3, Wyse Technology Corp. Pub. No. 883733-01 Rev. B, Aug. 2003.
Eizo Nanno Integrated LCD Monitors/Windows-based Terminals brochure, p. 2, Pub. No. 000402B, Printed in Japan, March 2001.
ViewSonic airpanel V150 Smart Display brochure, ViewSonic Corp., Pub. No. 10757-01B-12/02.0M, Dec. 2002.
ViewSonic Tablet PC V1250 brochure, ViewSonic Corp., Pub. No. 11480-01B-11/03, 2003.

* cited by examiner

*Primary Examiner*—Christopher Shin

(57) ABSTRACT

This invention adapts a stationary flat display for use as a portable computing and media device. The adaptation takes advantage of the predetermined mounting arrangements of the stationary flat display by inserting external modules between the predetermined mounting arrangements. When stationary, the flat display can continue its intended use as the primary display connected to a desktop computer system. The combination of the flat display with attached external modules is quickly released from stationary use to enable portable use for other applications.

17 Claims, 9 Drawing Sheets

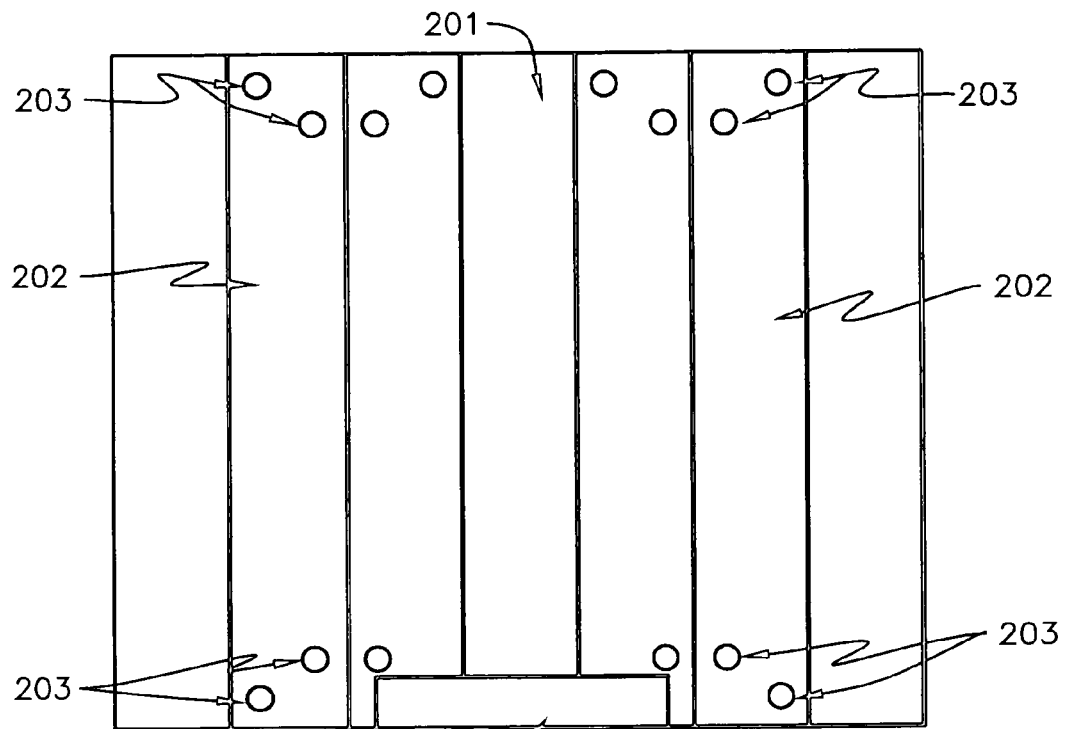
Fig. 2
Fig. 2A
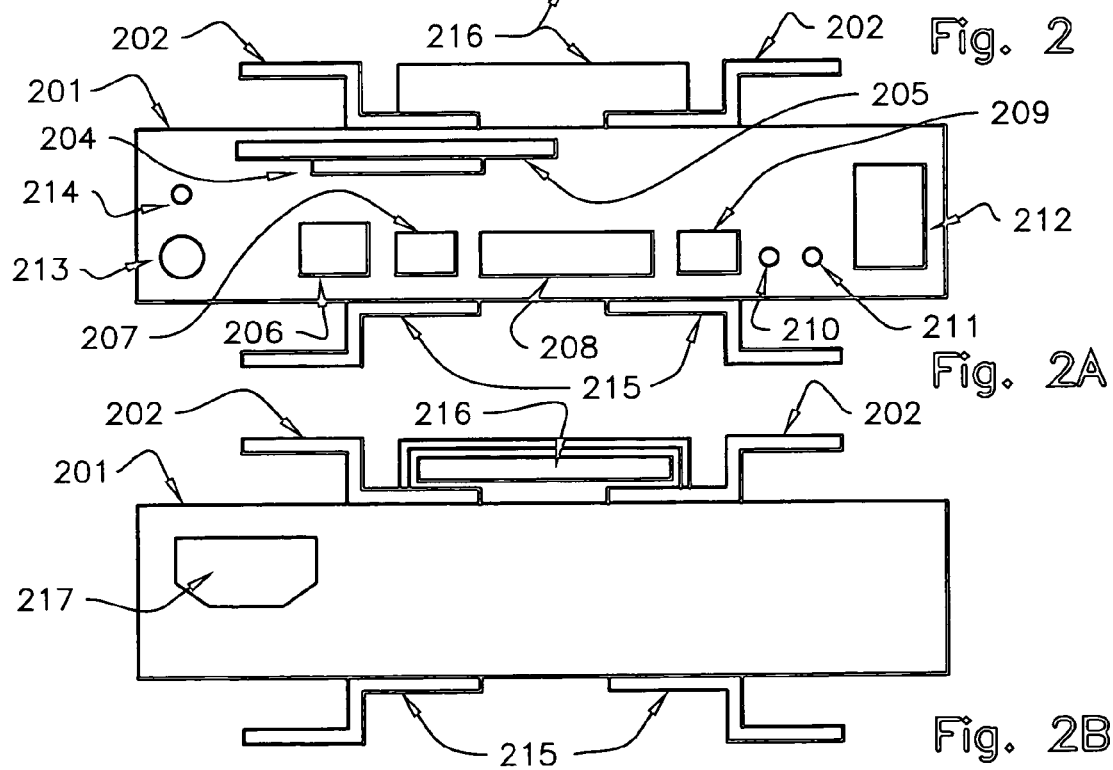
Fig. 2B

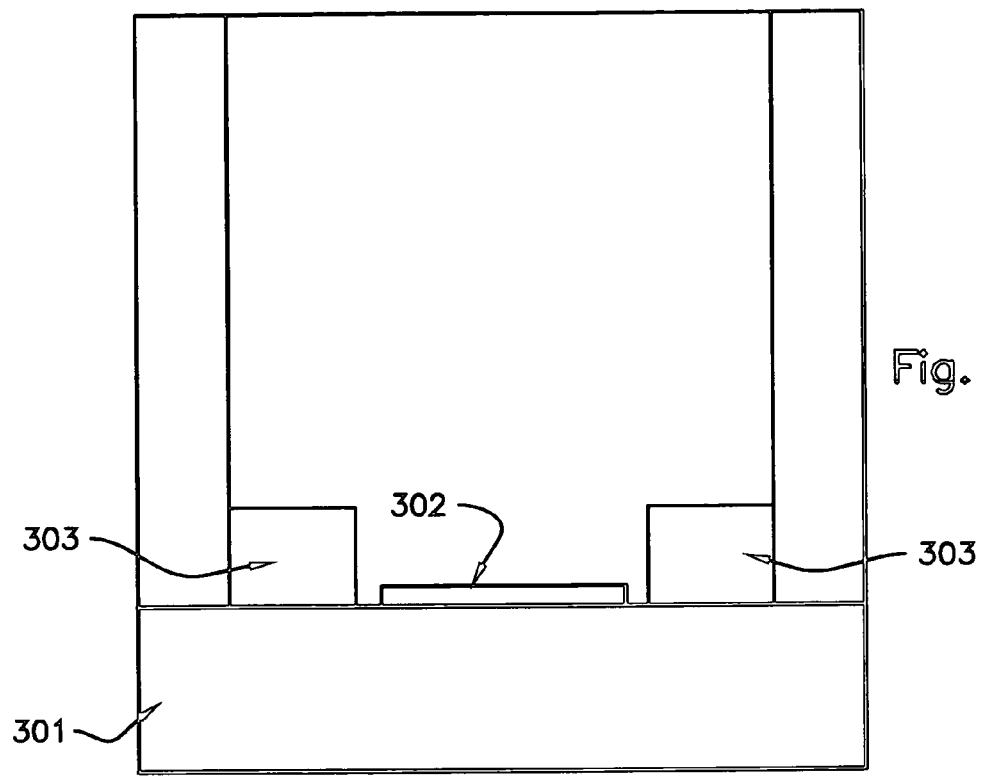
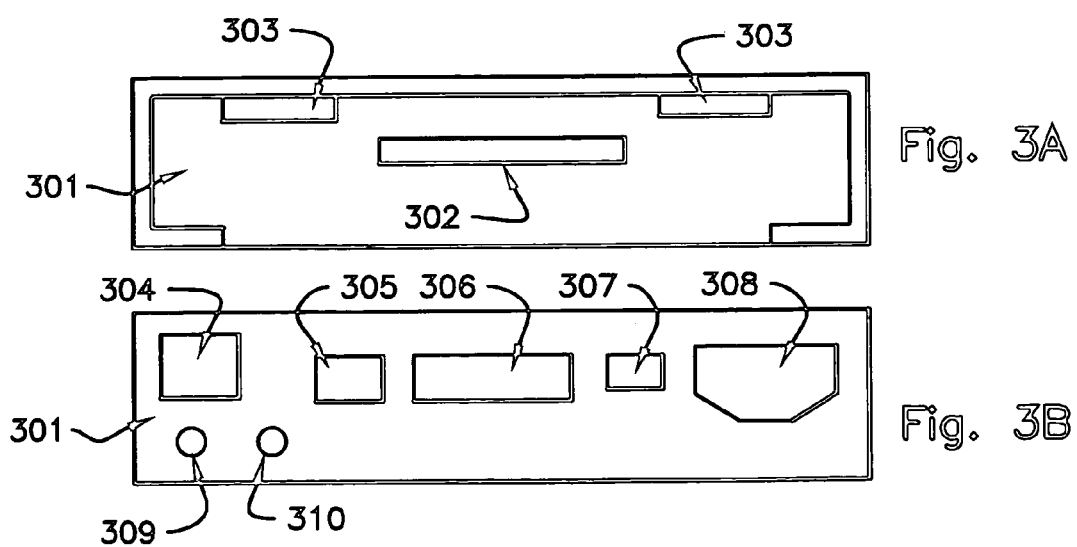
Fig. 3
Fig. 3A
Fig. 3B

PORTABLE FLAT DISPLAY ADAPTOR

CROSS-REFERENCE TO RELATED APPLICATIONS

This Utility Patent Application claims the benefit of Provisional Patent Application No. 60/510,296 filed by the inventor on Oct. 10, 2003.

STATEMENT REGARDING FEDERALLY SPONSORED RESEARCH OR DEVELOPMENT

Not Applicable.

REFERENCE TO SEQUENCE LISTING, A TABLE, OR A COMPUTER PROGRAM LISTING COMPACT DISC APPENDIX

Not Applicable.

BACKGROUND OF THE INVENTION

The invention relates to the adaptation of a general purpose flat display joined with a stand to function as a multi-purpose portable device for use in multiple applications. The invention preserves the integrity and original use of the fixed display, while allowing for a ready conversion to the portable device.

Recent product developments have popularized the concept of thin client computers, also known as network computers. Since the early embodiments of integrated LCDs with handheld computers popularized by Hawkins et al (U.S. Pat. No. 5,133,076), the present state of development of the network computer has evolved into a Smart Display and a Tablet PC. The main benefit of a Smart Display and Tablet PC over traditional computer systems is that a Smart Display and Tablet PC are lightweight and can be transported and used as a handheld computer. Both a Smart Display and Tablet PC commonly integrate a Flat Panel Display or LCD display, hereafter referred to as a Flat Display. But unlike the general purpose Flat Displays commonly used as a peripheral to a computer system, a Smart Display and Tablet PC build on a Flat Display and replicate and integrate within a Flat Display enclosure many of the functions of a computer system, including CPU, input method (usually in the form of a touch-sensitive screen), network connectivity, and peripheral ports. This highly functional integration of a Smart Display and Tablet PC adds nearly two to three times the cost of a Flat Display by itself.

In addition, a Smart Display and Tablet PC may include an optional docking station to store a Smart Display and Tablet PC in a fixed location when not being used as a handheld. Typically, in the docked configuration, a Tablet PC continues to function as a self-contained computer, while a Smart Display is intended to be used as the primary display of an existing computer system. The docking station is proprietary, and presently can only be mated with a Smart Display and Tablet PC of the same make or manufacturer. Because the docking station is highly specialized, it can add as much as half the cost of a smaller Flat Display to a Smart Display and Tablet PC system.

A Smart Display and Tablet PC are further differentiated by the level of software integration with the integral motherboard. A Tablet PC is a self-contained computer that can run applications on a host operating system, similar to a traditional desktop computer. A Smart Display functions as a remote terminal to mirror the operating environment of a host computer system such as a desktop. It communicates with the host computer over a network using a remote display protocol. Examples of these protocols are used by the X Window System, Citrix's ICA, and Microsoft's RDP. In some instances it is possible for a Smart Display to run applications independently on a scaled-down version of the host computer system.

In all cases of the prior art of thin clients and network computers, including the Smart Displays and Tablet PCs, is that to achieve an integrated portable handheld system with internal processing of applications and/or remote terminal capability requires the use of hardware integrated within the enclosure of a Flat Display. While it is possible to connect external computing and I/O devices to a Flat Display to enable it to perform as a Smart Display and Tablet PC, these devices up to now have not been adapted in a way as to be portable while being integrated with any ordinary Flat Display enclosure and stand.

In Dankman, et al (U.S. Pat. No. 5,491,609), an object of the invention is a self-contained computing system (re: "pen-based notebook computer") with processing integral to the Flat Display enclosure. Slots exist externally on the computing system enclosure, which provides for docking bays on the Flat Display to expand the system. Further, the data bus must be exposed from the internal enclosure to permit the sliding of modules into rails for expansion purposes. This method is entirely similar to that used by the PCMCIA standard; the only difference is that the form factor of the expansion modules in the Dankman patent appears to be larger than that used by the PCMCIA standard. The obvious advantages of using a standard form factor such as PCMCIA are evident by its continued use today.

In the Sallam patent (U.S. Pat. No. 6,421,232), a dual purpose Flat Display (re: "TCFPD") incorporates the capability to function as a standalone display when used with a standard computer (re: "fat client"), or in a detached mode can function as a thin client. However, the TCFPD must rely on its integral (internal) thin client motherboard and hardware when acting as a thin client in the detached mode.

Wyse Technology, a manufacturer of thin client terminals, claims that the Wyse Winterm 1200LE can be mounted on the back of a Flat Display using a predetermined mounting arrangement. Further investigation reveals that only four Flat Displays are supported, because the stand on each of these four Flat Displays are mounted to the Flat Display in a location separate from the predetermined mounting holes. These particular Flat Displays thus support an additional attachment of a thin client computer to the unused mounting holes. Further, the Flat Display with the attached thin client remains fixed to its stand and therefore is neither portable nor easily detachable from the stand like a Smart Display and Tablet PC. The thin terminal has no capability to allow the Flat Display to be used for other purposes, thus the Flat Display is dedicated to the thin terminal use and the Flat Display may not be used with other intended applications without first disconnecting the Flat Display input from the thin client.

Eizo Nanao Technologies manufactures Windows Based Terminals. These Windows Based Terminals have a detachable Flat Display that can be mounted on a separate monitor arm or wall, but the Windows Based Terminals is integrated with the enclosure of the Flat Display. The Windows Based Terminal is not designed to be integrated with a generic Flat Display with stand, but requires the specific Flat Display with stand included with the Windows Based Terminals. Unlike a Smart Display, these Windows Based Terminals do not allow for dual-use as a remote terminal and primary display for a stand-alone desktop computer.

A Smart Display and Tablet PC enable some or all of the functionality of a fixed location desktop computer within an internal Flat Display enclosure. A Flat Display enclosure of a Smart Display and Tablet PC is purposely designed to integrate the electronics and features required for this functionality. Because an ordinary Flat Display enclosure was not designed to accommodate the electronics required for the computer functions, it would be difficult for someone skilled in the art to retrofit an interchangeable solution for all sizes and makes of Flat Displays.

Some special purpose computers have been integrated with OEM Flat Displays for industrial and commercial use, such as in kiosks. These "Panel PCs" or "LCD PCs" are designed for a specific use and are not adaptable to a COTS Flat Display, nor are they intended to be detachable, handheld, or portable once integrated with a Flat Display.

Further recent developments in flat panel integration have resulted in multimedia Flat Displays for dual computer and entertainment use. These Flat Displays, along with general purpose CRTs and televisions have been integrated with computing and multimedia capabilities to play, record, catalog, and arrange multimedia content including music and video. Like the Smart Display and Tablet PC mentioned before, these multimedia Flat Displays are hybrid systems, offering some of the features of both a desktop computer and entertainment system, but are fully integrated within the enclosure of a Flat Display or CRT. There are also separate media servers, or appliances, which can be connected to a Flat Display, but these systems are not adaptable to attach to a generic Flat Display for portable or handheld use.

BRIEF SUMMARY OF THE INVENTION

The first object of this invention is to enable the adaptation of an integral Flat Display and stand (joined by a predetermined mounting arrangement) for use as a portable and remote self-contained computer. The adaptation preserves the integrity and functionality of the integral Flat Display and stand for its original intended uses. The self-contained computer consists of the Flat Display and the core module (attached to the Flat Display) containing a CPU, a power supply (line and/or battery), network connectivity (wired and/or wireless), and I/O through ports, sockets and jacks used for computer peripheral devices, and further expansion capability. The Flat Display can obtain its power and I/O signals directly from the core module using external cabling, or the power can be connected directly to a line source. Together, the Flat Display with attached core module will be referred to hereafter as the Smart Device Unit. A receptacle, which can vary from a surface with mounting guides to an enclosure with an opening, is attached to the stand to dock the Smart Device Unit. This receptacle will be referred to hereafter as the Smart Device Unit Docking Station. The Smart Device Unit Docking Station can contain a power supply to recharge the Smart Device Unit, and can replicate several of the input ports used by the Flat Display to allow for pass-through of the required signals and power to the Flat Display when the Smart Device Unit is joined with the Smart Device Unit Docking Station. The port configuration can vary, depending on the application. The Smart Device Unit Docking Station can serve as a general-purpose enclosure to insert modules interchangeably. The Smart Device Unit automatically detects the presence and configuration of the Smart Device Unit Docking Station port configuration, and makes application-specific features available, accordingly.

The second object of the invention is to enable the Smart Device Unit to be quickly released from the Smart Device Unit Docking Station through electromechanical and mechanical (failsafe) operations. When inserted in the Smart Device Unit Docking Station, the Smart Device Unit can be secured by a latch mechanism. This latch mechanism can be released through software activation (e.g., using a password), or using a key with a mechanical lock. Once the latch mechanism is released, the Smart Device Unit can be detached from the Smart Device Unit Docking Station.

The third object of this invention is to provide two methods of Smart Device Unit operation, attached mode and detached mode. In attached mode, the Smart Device Unit is secured to the Smart Device Unit Docking Station, and the Flat Display retains its original function as an output device for a separate computer with signals passed through the Smart Device Unit Docking Station to the Flat Display. In detached mode, the input video signal of the separate computer is disabled, and the Smart Device Unit can be physically detached from the Smart Device Unit Docking Station. The Smart Device Unit can then function as a self-contained computer, which can be augmented through additional multiple connected peripherals, such as a mouse, trackball, pen, touchpad, touch screen adaptor, keyboard or other tactile input devices; microphones, headphones, speakers, and external storage devices. The peripherals can be directly attached to the Smart Display Unit, or via cabling or wireless options.

The fourth object of this invention is that the Smart Display Unit when in detached mode can simultaneously operate as a Tablet PC (i.e., run a host operating system and applications) and as a Smart Display (i.e., mirror the operating environment of a remote computer) at a significantly lower cost than purchasing either a Smart Display Unit or Tablet PC. Using a comparable Flat Display, it is conservatively estimated that a Smart Display with docking station will have a manufactures suggested retail price of at least twice that of the Smart Device Unit with Smart Device Unit Docking Station, while a Tablet PC with docking station will have a manufactures suggested retail price of at least three times that of the Smart Device Unit with Smart Device Unit Docking Station.

The fifth object of this invention is that the Smart Device Unit can accommodate any Flat Display with a predetermined mounting arrangement (such as that specified by the VESA FDMI standard, or as that influenced by the marketplace), enabling the Smart Device Unit to be interchangeable with the Smart Device Unit Docking Station to accommodate varying screen sizes and features. One advantage of this object is that the Smart Device Unit with a smaller Flat Display can be detached from the Smart Device Unit Docking Station and swapped with the Smart Device Unit with a larger Flat Display to accommodate a user with a visual impairment.

The sixth object of this invention is to enable multiple Flat Displays and integral stands to each be adapted as the Smart Device Unit with Smart Device Unit Docking Station and then be used in a multi-user environment. The multi-user environment allows multiple users in separate locations to share a single primary computer such as a desktop. This allows multiple logical instances of a Smart Display (one for each detached Smart Device Unit) to be hosted by the shared computer. When the detached Smart Device Unit is being used as a Tablet PC, the shared desktop computer can share its resources, such as file sharing and shared Internet access for each of the Smart Device Units.

The seventh object of this invention is to provide for external expansion modules joined with the Smart Device Unit when in detached mode for added functionality. Unlike a Smart Display and Tablet PC, which must expose an internal data bus and ports through a Flat Display enclosure, the external expansion modules utilize the external data bus of the Smart Device Unit's external core module, via a predetermined connector system widely known in the art. The attachment of the Smart Device Unit core module with the expansion modules or with the Smart Device Unit Docking Station would result in the data bus being engaged, without further connections. Examples of modules include a spare or extended battery pack, external hard disk drive pack, and a portable audio or video pack (i.e., CD-ROM/DVD-ROM) to play music or videos. Modules can be stacked in the front or rear of each module, and are interchangeable to work while joined with the Smart Device Unit or Smart Device Unit Docking Station modules. For example, a battery extension module when stacked on the core module of the detached Smart Device Unit is an active power source; when inserted in the Smart Device Unit Docking Station, it is recharged through line power supplied to the Smart Device Unit Docking Station. It should be obvious from the interchangeability of the modules that the order of attachment of modules, including the core module, is inconsequential to the overall function of the invention. The attachment of the external expansion modules replicates the predetermined mounting arrangement, so that the Smart Device Unit Docking Station and Smart Device Unit can be used with off the shelf Flat Display arms, wall mounts, pole mounts, and other mounting devices utilizing the same predetermined mounting arrangement for ease of use and increased flexibility.

The eighth object of this invention is that the Smart Device Unit Docking Station can optionally provide a wireless access point for the Smart Device Unit when detached from the Smart Device Unit Docking Station. Because the first object of this invention is to enable a Flat Display to become a portable self-contained computer, it is likely that in a location where previously a single Flat Display and single desktop computer existed, there was no prior need for a wireless network. To save the added expense and complexity of purchasing a separate wireless access point, when the Smart Device Unit is in detached mode the Smart Device Unit Docking Station can accept an external expansion module that contains a wireless access point and ethernet port. The ethernet port can be connected to the adjacent computer, or to a wired hub/router, for a bridged or routed network and Internet connection. Utilizing this object of the invention enables a user to eliminate the expense of a separate desktop computer and adapt a Flat Display to access the Internet.

The ninth object is for the invention to be adaptable to applications other than personal and business computing. Examples of applications include: entertainment, automotive, industrial, military, healthcare, retail, and inventory. Because the Smart Device Unit Docking Station and Smart Device Unit externally replicates the predetermined mounting arrangement, the Smart Device Unit Docking Station and Smart Device Unit can be used with off the shelf Flat Display arms, wall mounts, pole mounts, and other mounting devices utilizing the same predetermined mounting arrangement for ease of use and increased flexibility.

BRIEF DESCRIPTION OF THE DRAWING

FIG. 2, FIG. 2A, and FIG. 2B are the rear, top and bottom view respectively, of the Smart Device Unit core module.

FIG. 3, FIG. 3A, and FIG. 3B are the front, top and bottom view respectively, of the Smart Device Unit Docking Station.

DETAILED DESCRIPTION OF THE INVENTION

Preferred embodiments of the invention applying a device adaptor to a generic Flat Display with stand will be explained below. As new devices and applications become known in the art, these will be adapted to the current embodiments of the invention. Each of the three primary components of the preferred embodiment will be described first.

Figure 1:
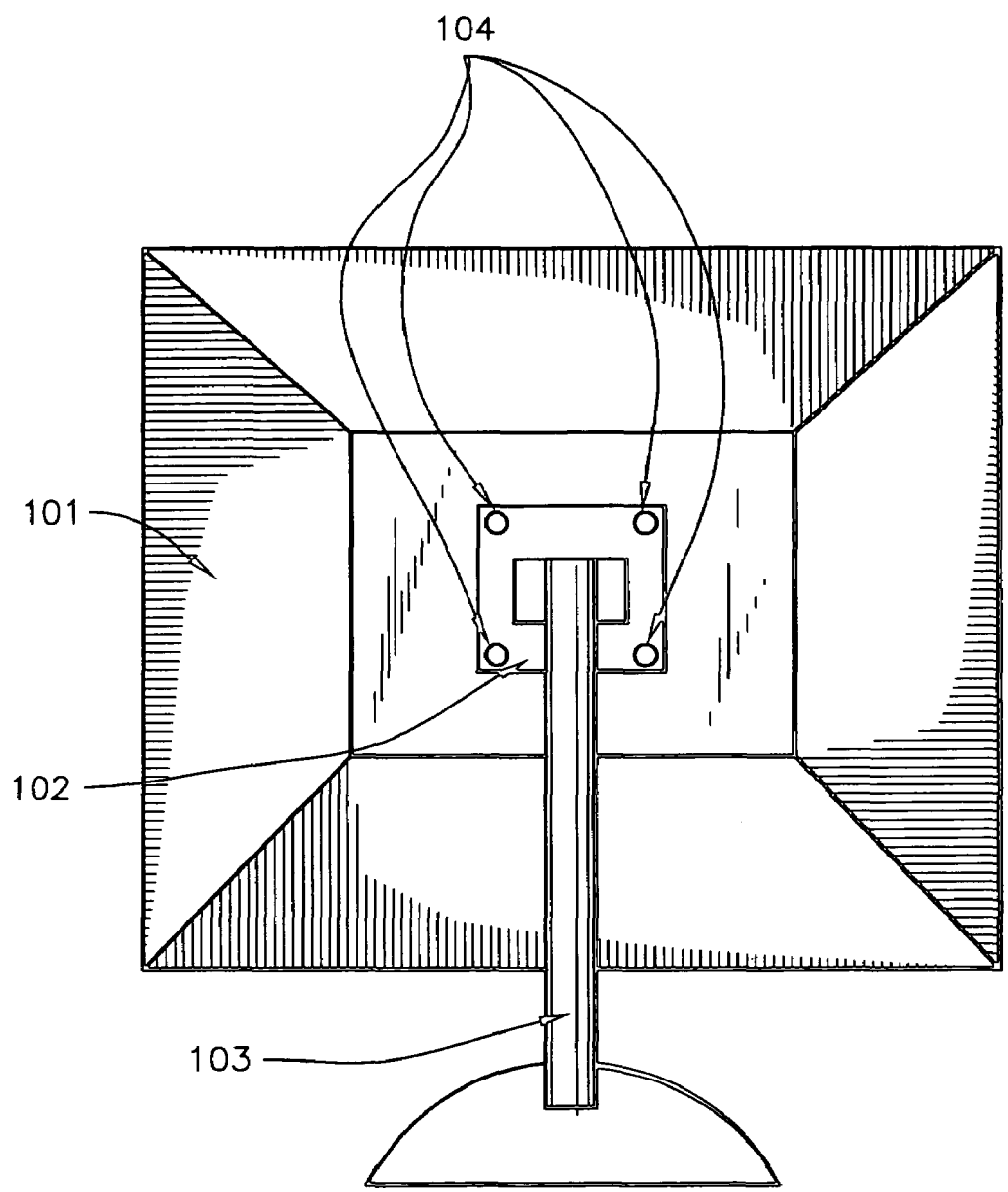
FIG. 1 is a rear view of an ordinary Flat Display mounted via mounting plate to the Flat Display stand.

An ordinary COTS Flat Display 101 with stand 103 is shown from the rear in FIG. 1. The Flat Display 101 is attached to the stand 103 through a mounting plate 102. The mounting plate 102 is joined to the Flat Display 101 using screws or bolts which pass through mounting holes 104 that are positioned according to the predetermined mounting arrangement. The size of the mounting plate 102 and the position of the mounting holes 104 can be adapted for the size and weight of the attached Flat Display 101, as specified by the predetermined mounting arrangement.

FIG. 2 shows the rear view of the Smart Device Unit core module 201. The Smart Device Unit core module 201 has attached rear mounting brackets 202 with the exposed predetermined mounting holes 203 corresponding to the mounting holes 104 of the mounting plate 102. From this viewpoint, the Smart Device Unit core module 201 can become fixed by attaching to the stand 103 via the mounting plate 102, shown in FIG. 1; or, in the preferred embodiments, it can become detachable by insertion into the Smart Device Unit Docking Station 301, shown in FIG. 7; or it can be joined with an expansion module such as an extended battery pack 501, shown in FIG. 6.

In FIG. 2A, the top view of the Smart Device Unit core module shows several exposed I/O ports and expansion slots. A current embodiment consists of: a CompactFlash slot 204 to accommodate cards for networking and storage and other applications; a PCMCIA slot 205, also to accommodate larger form factor cards for networking and storage and other applications; a 10/100 Ethernet socket 206 to accommodate wired network connections; and USB ports 207, available for common peripheral expansion, such as an external keyboard and mouse. In this embodiment, the Flat Display 101 video signal is supplied through the VGA or DVI video output 208, and an optional IEEE 1394/FireWire interface 209 is available for direct connection to devices such as video cameras. An audio out 210 and microphone input 211 are supplied for speakers and microphone. A power cable adaptor is connected from the power socket 212 to the Flat Display 101 to eliminate the need to connect and disconnect the power cable whenever the Smart Device Unit and optional expansion module is attached to or detached from the Smart Device Unit Docking Station 301. The Smart Device Unit core module 201 can be powered on or off using the power button 213; power status is shown by the status light 214. The front mounting brackets 215 are to be attached to the rear of the Flat Display 101 (see FIG. 6) through mounting holes using the predetermined mounting arrangement. All mounting brackets are designed as such to permit easy access to mounting bolts or thumb screws. There are other embodiments of connecting the Smart Device Unit core module 201 and Flat Display 101, such as using stackable fittings; or other types of slides, tracks, or channels as guides to slide or stack the mount and latch it into place.

The bottom view of the Smart Device Unit core module in FIG. 2B shows a data bus socket 216 for direct connection to external expansion modules or the Smart Device Unit Docking Station 301. The data bus socket 216 is positioned orthogonally at the base of the rear of the Smart Device Unit core module 201 to facilitate the connection between external expansion modules or the Smart Device Unit Docking Station 301, eliminating the need for external cables between modules. A power supply connection 217 is provided for an external power source when the Smart Device Unit is removed from the Smart Device Unit Docking Station 301 and also as a way for recharging batteries which are connected through the data bus socket 216.

Figure 4B:
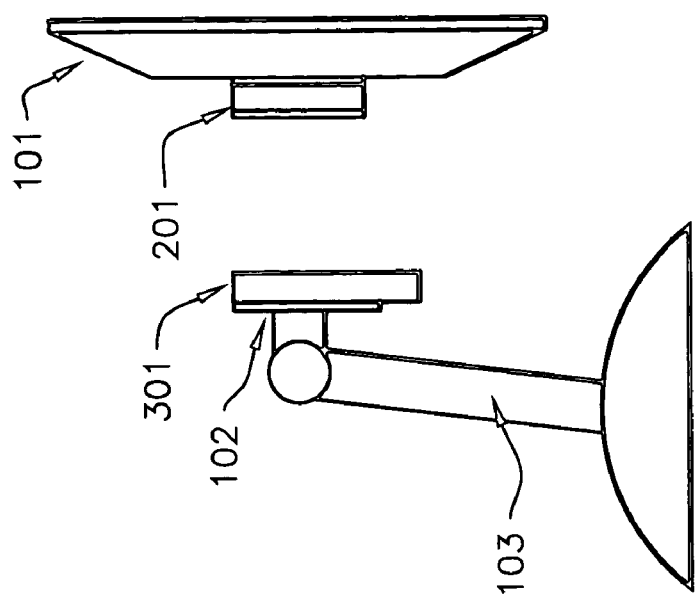
FIG. 4B is the side view of the Smart Device Unit detached from the Smart Device Unit Docking Station and stand (detached mode).
Figure 7:
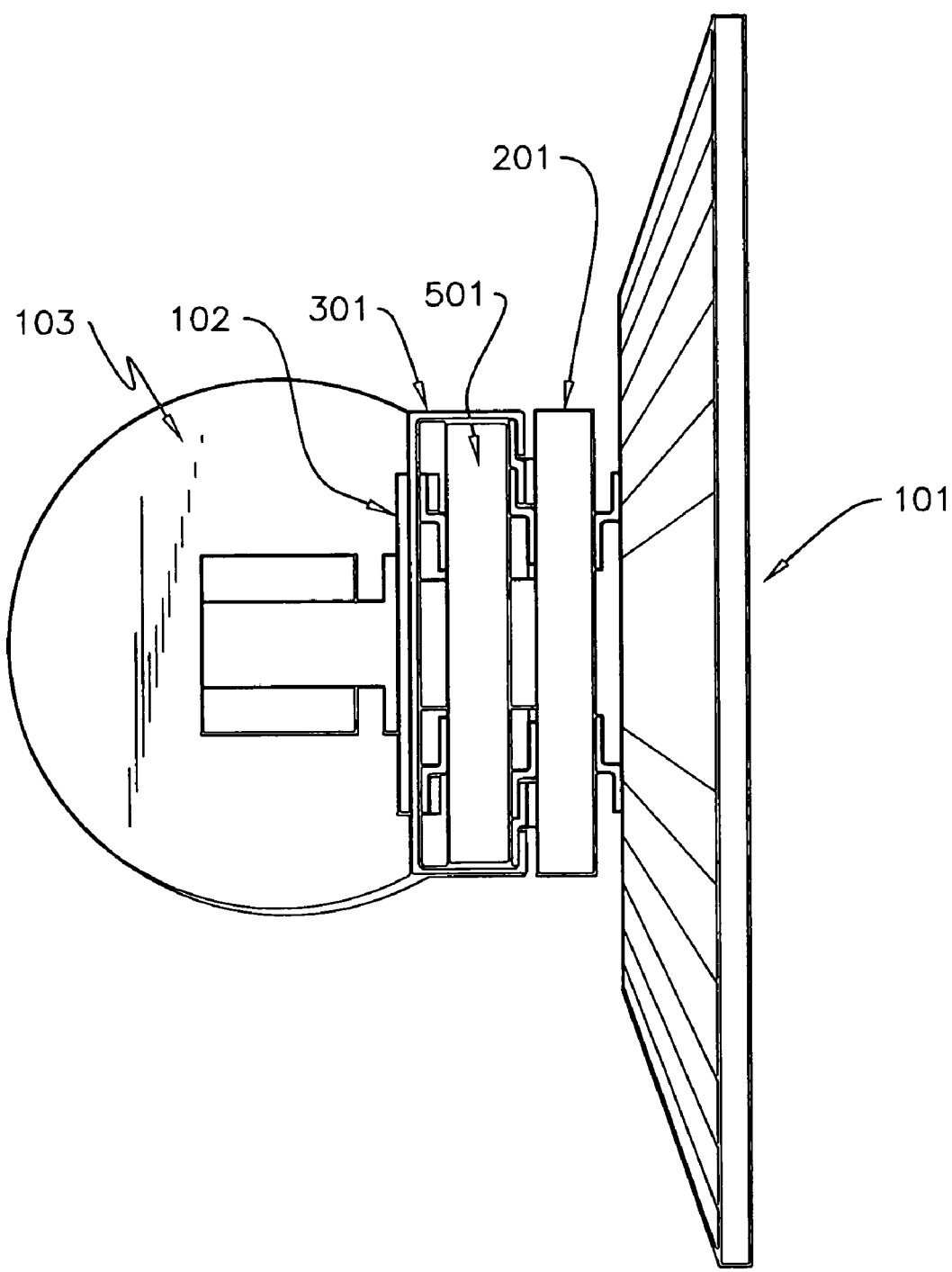
FIG. 7 is the top view of the Smart Device Unit in attached mode joined with the Smart Device Unit Docking Station and stand.

FIG. 3 shows the front view of the Smart Device Unit Docking Station 301. The front of the Smart Device Unit Docking Station 301 faces the rear of the Flat Display 101. When inserting the Smart Device Unit core module 201 or an expansion module into the Smart Device Unit Docking Station 301, a front opening of the Smart Device Unit Docking Station 301 allows mounting brackets to extend through the opening to a Flat Display 101, to an expansion module, or between an expansion module and the Smart Device Unit core module 201. When the Smart Device Unit core module 201 is inserted into the Smart Device Unit Docking Station 301, the bus connection riser 302 of the Smart Device Unit Docking Station 301 is connected directly into the external data bus socket 216 of the Smart Device Unit core module 201, as shown in FIG. 4B. When the expansion module is used, it can be inserted in the same manner, as shown in FIG. 7.

In FIG. 3A, the top view reveals the top opening of the Smart Device Unit Docking Station 301, exposing the bus connection riser 302 and mounting clamps 303. When the Smart Device Unit core module 201 or an expansion module is inserted into the Smart Device Unit Docking Station 301, the bottom of the mounting brackets comes in contact with the top of the mounting clamps 303 and causes the top of the mounting clamps 303 to deflect away from the mounting brackets until pins on the adjoining face of the mounting clamps 303 are mated with the mounting holes of the mounting brackets. The mounting clamps 303 hold the Smart Device Unit core module 201 or expansion module securely in the Smart Device Unit Docking Station 301 until mounting clamps 303 are disengaged by mechanical or electromechanical actuated latches.

In FIG. 3B, several I/O ports are shown on the bottom of the Smart Device Unit Docking Station 301. The ports on the bottom of the Smart Device Unit Docking Station 301 replicate the inputs to the Flat Display 101 to pass through the signals to the Flat Display 101 via the bus connection riser 302 when the Smart Device Unit is in attached mode. This simplifies the connection between the Smart Device Unit and Smart Device Unit Docking Station 301 and eliminates the need to connect and disconnect cables whenever the Smart Device Unit is attached or detached from the Smart Device Unit Docking Station 301.

The exposed ports on the bottom of the Smart Device Unit Docking Station 301 can be configured according to the application of the invention. The following ports on the bottom of the Smart Device Unit Docking Station 301 are shown in FIG. 3B for pass through of the signals from another computer or network: a 10/100 Ethernet socket 304; USB ports 305; a video input 306; an IEEE 1394 input 307; a line power source 308; an audio input 309; and a microphone input 310. When a video signal is applied to the video input 306, the video signal is always passed through to the Flat Display 101. This enables the Flat Display 101 to function for its original intended purpose, even when the Smart Device Unit core module is powered off. When the Smart Device Unit core module 201 is powered on, it detects the live input video signal and disables itself; when the live input video signal is removed or absent, the Smart Device Unit core module 201 when powered on will detect the absence of the live video signal and go into detached mode. When in detached mode and the Smart Device Unit is physically attached to the Smart Device Unit Docking Station 301, all of the remaining input signals are available for use by the Smart Device Unit. All of the input signals are automatically disabled when the Smart Device Unit is physically detached from the Smart Device Unit Docking Station 301 (i.e., the external data bus socket on either the Smart Device Unit core module 201 or the expansion module is separated from the bus connection riser 302 of the Smart Device Unit Docking Station 301.)

When the line power source 308 of FIG. 3B is active, the line power is passed through an AC/DC transformer within the enclosure of the Smart Device Unit Docking Station 301. Power supplied to the Smart Device Unit Docking Station 301 is transferred through the bus connecting the Smart Device Unit Docking Station 301 to the expansion module and the Smart Device Unit.

Figure 4A:
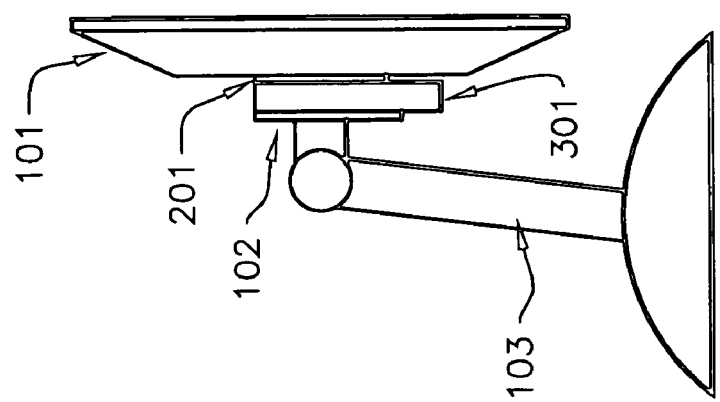
FIG. 4A is the side view of the stand with Smart Device Unit Docking Station, joined with the Smart Device Unit (attached mode)
Figure 4:
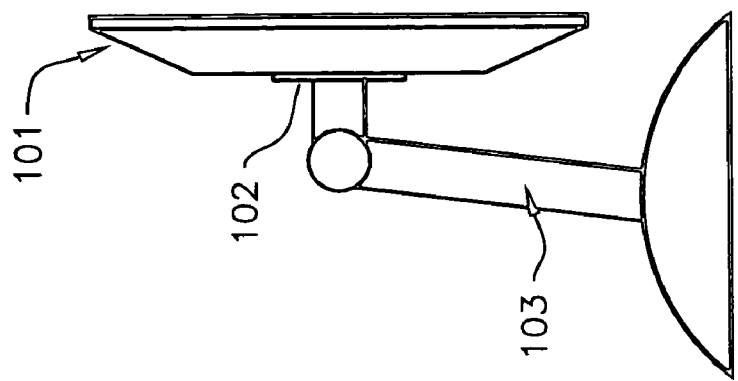
FIG. 4 is a side view of the Flat Display with stand.

In FIG. 4, a mounting plate 102 fastens the Flat Display 101 to the stand 103 by the predetermined mounting arrangement, also shown in FIG. 1. In FIG. 4A, an Smart Device Unit (i.e., an Flat Display 101 with attached Smart Device Unit core module 201), is inserted into the Smart Device Unit Docking Station 301; the Smart Device Unit Docking Station 301 is now attached to the stand 103 via the mounting plate 102, while the front mounting brackets 215 of the Smart Device Unit core module 201 are joined to the rear of the Flat Display 101. In FIG. 4B, the partially exploded diagram reveals the Smart Device Unit core module 201, previously concealed in attached mode within the Smart Device Unit Docking Station 301 in FIG. 4B, joined to the Flat Display 101 in detached mode.

Figure 5:
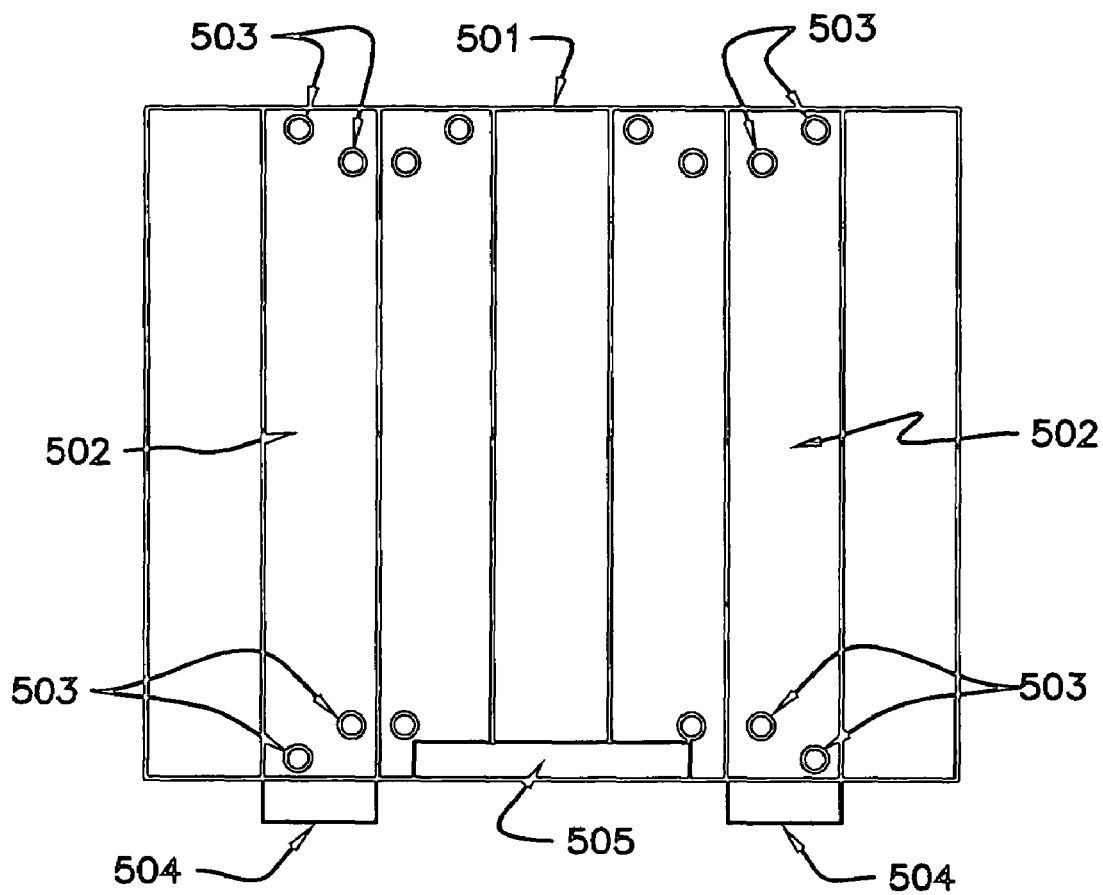
FIG. 5 and FIG. 5A shows the rear and bottom view respectively, of the expansion module.

FIG. 5 shows one example of an expansion module, an extended battery pack 501. The extended battery pack 501 expansion module provides power to the Smart Device Unit and other attached expansion modules. Expansion modules have one pair of rear mounting brackets 502 with mounting holes 503 that are positioned according to the predetermined mounting arrangement. All expansion modules have two external data bus sockets, for interconnecting between the Smart Device Unit Docking Station 301 (or another expansion module), and the Smart Device Unit core module 201.

Figure 5A:
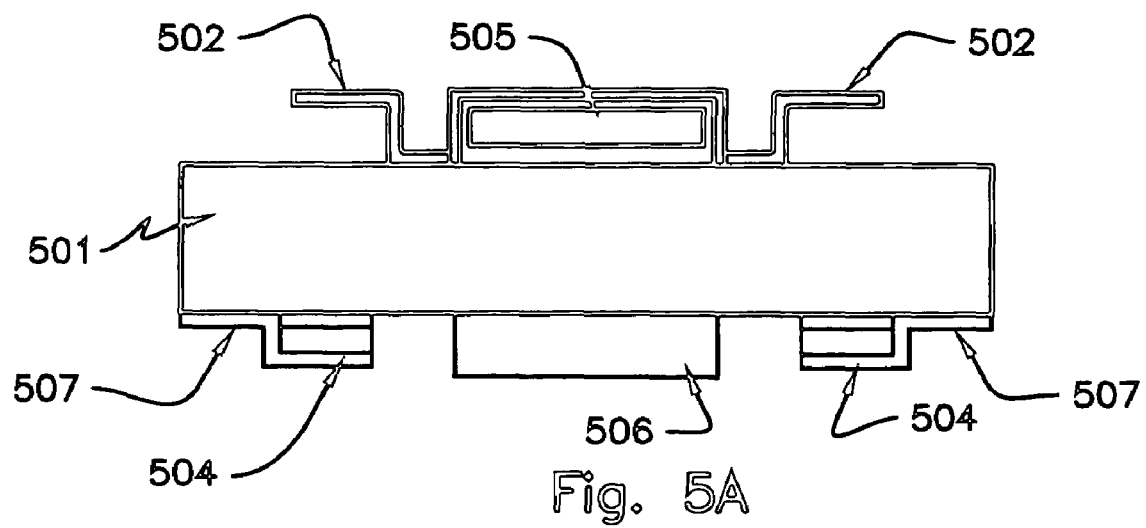

When the Smart Device Unit with expansion module is inserted into the Smart Device Unit Docking Station 301, the rear mounting brackets 502 of the expansion module will be secured by the mounting clamps 303 of the Smart Device Unit Docking Station 301, and the bus connection riser 302 of the Smart Device Unit Docking Station 301 is aligned and connected directly into the external data bus socket 505. The other external data bus riser 506 in FIG. 5A will be aligned and connected to the external data bus socket 216 of the Smart Device Unit core module 201 (or another expansion module) when the expansion module is joined with the Smart Device Unit core module 201. The rear mounting brackets 202 of the Smart Device Unit core module 201 (or the rear mounting brackets 502 of another expansion module) attach to the front side of the expansion module by inserting the bottom of the rear mounting brackets 202 into the top of the mounting guides 507 and sliding the expansion module upward until the bottom of the rear mounting brackets 202 engages the top of the mounting clamps 504 at the bottom of the mounting guides 507. Continued downward force at the bottom of the mounting brackets 202 causes the top of the mounting clamps 504 to deflect away from the mounting brackets until pins on the adjoining face of the mounting clamps 504 are mated with the mounting holes 203 of the mounting brackets 202. The mounting clamps 504 hold the Smart Device Unit core module 201 and expansion module securely until the mounting clamps 504 are disengaged by pressing the external tabs on the mounting clamps 504 away from the expansion module. This action results in the pins on the face of the mounting clamps 504 being extricated from the mounting holes 203, and results in a rotation of the mounting clamps 504 which applies upward pressure on the mounting brackets 202, which forces the expansion module to be released from the secured position. The mounting brackets and mounting guides are one embodiment of a simple and low-cost solution. There are other embodiments of connecting the Smart Device Unit core module 201 and expansions modules, such as using stackable fittings; or other types of slides, tracks, or channels as guides to slide or stack the mount and latch it into place.

Figures 6, 6A:
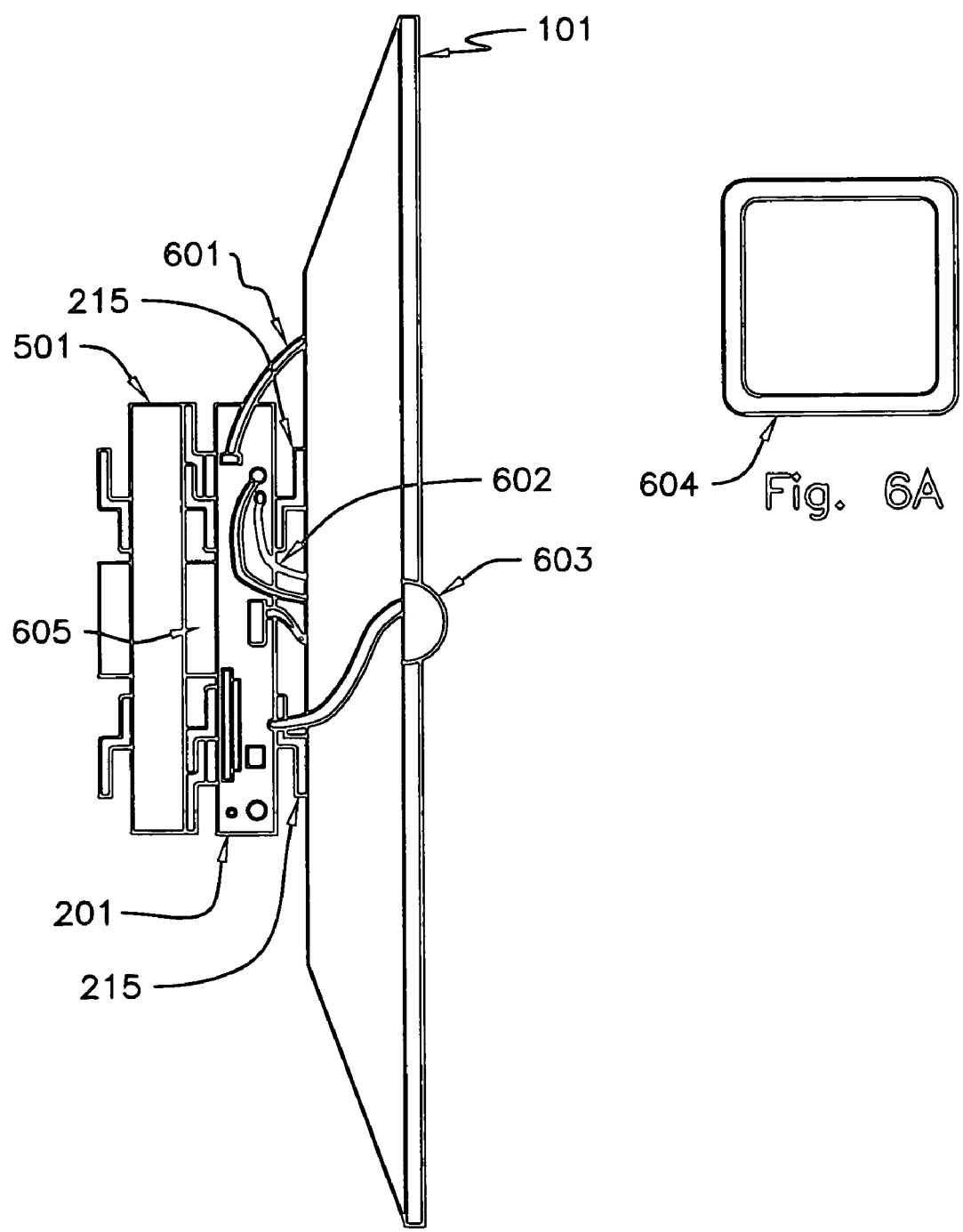
FIG. 6 is the top view of the Smart Device Unit in detached mode with an input device in FIG. 6A.

In FIG. 6, the Smart Device Unit (shown here in detached mode) consists of the Smart Device Unit core module 201 attached to the Flat Display 101. The rear mounting brackets 202 of the Smart Device Unit core module 201 are attached to an extended battery pack expansion module 501. The extended battery pack's power and signaling is transferred through the interconnection 605 between the external data bus riser 506 of the expansion module and the external data bus socket 216 of the Smart Device Unit core module 201. The power to the Flat Display 101 is passed through the Smart Device Unit core module 201 via the power adaptor cable 601. The mounting brackets 215 create a space between the Smart Device Unit core module 201 and the rear of the Flat Display 101 for a cable race 602. The advantage of using the cable race 602 is that cables from the video and I/O ports are concealed and avoid being tangled. Another embodiment could enable the Smart Device Unit core module 201 to be inverted and all ports and cables would be connected from the bottom side of the monitor, thus avoiding the need for a cable race. This embodiment could use the aforementioned options of mounting bracket and mounting guides, or slides, tracks or channels to slide or stack the mount on the Smart Device Unit core module 201 into place and engage the bus of the expansion module or the Smart Device Unit Docking Station 201.

In this embodiment of the Smart Device Unit in FIG. 6, a USB-to-IRDA adaptor 603 is used with a programmable touchpad 604 in FIG. 6A to provide on-screen remote control of devices, as well as keyboard emulation. One application using this embodiment could enable the Smart Device Unit to wirelessly access a remote home entertainment media computer to display content on the Flat Display 101 and control it interactively using the on-screen remote control emulation and programmable touchpad 604.

FIG. 7 shows a top view of the Smart Device Unit (consisting of the Flat Display 101 and Smart Device Unit core module 201 attached to the Flat Display 101 using the predetermined mounting arrangement), joined with an expansion module 501 and inserted into the Smart Device Unit Docking Station 301 which is attached to the stand 103 with a stand mounting plate 102 using the predetermined mounting arrangement.

Figure 8:
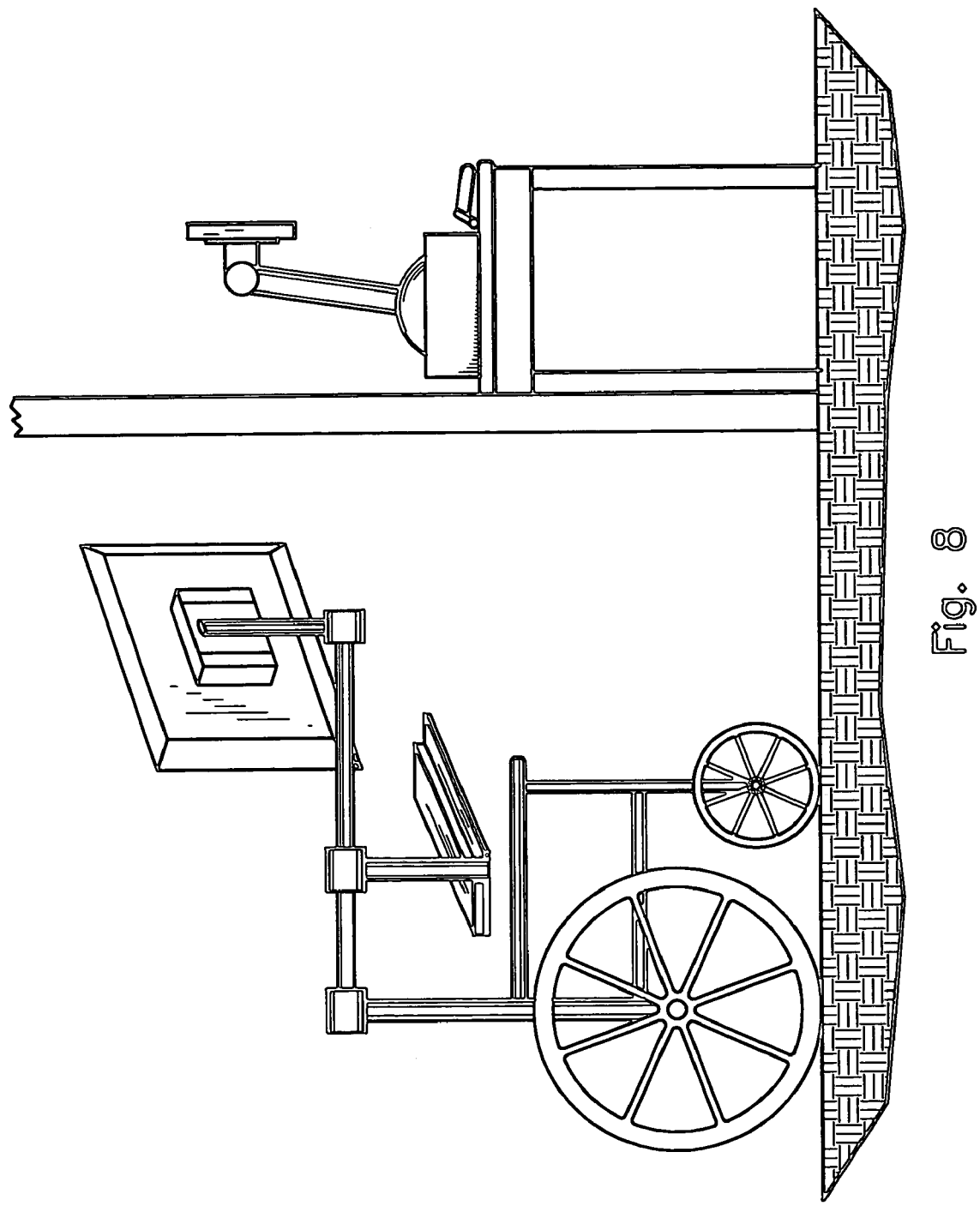
FIG. 8 shows the Smart Device Unit, mounted to a wheelchair Flat Display arm, communicating with a remote desktop computer.

FIG. 8 shows an application of the Smart Device Unit attached to a wheelchair's articulated Flat Display arm utilizing the predetermined mounting arrangement. The Smart Device Unit is inserted into a set of mounting guides which are similar to the mounting guides 507 attached to an expansion module. A wireless network connection in the Smart Device Unit enables the wheelchair's user to mirror the operating environment of a remote computer on the Flat Display, while maintaining mobility. An optional second Smart Device Unit Docking Station could be attached to the wheelchair's Flat Display arm instead of the mounting guides, which would enable the second keyboard and other peripherals used on the wheelchair to remain connected to the second Smart Device Unit Docking Station, thereby enabling simplified accessibility for the physically challenged. A primary Smart Device Unit Docking Station is attached to the original Flat Display stand in an adjacent room. The Flat Display stand sits on a desktop computer; the Smart Device Unit Docking Station replicates the ports of the desktop computer that are used by the Smart Device Unit and Flat Display.

Figure 9:
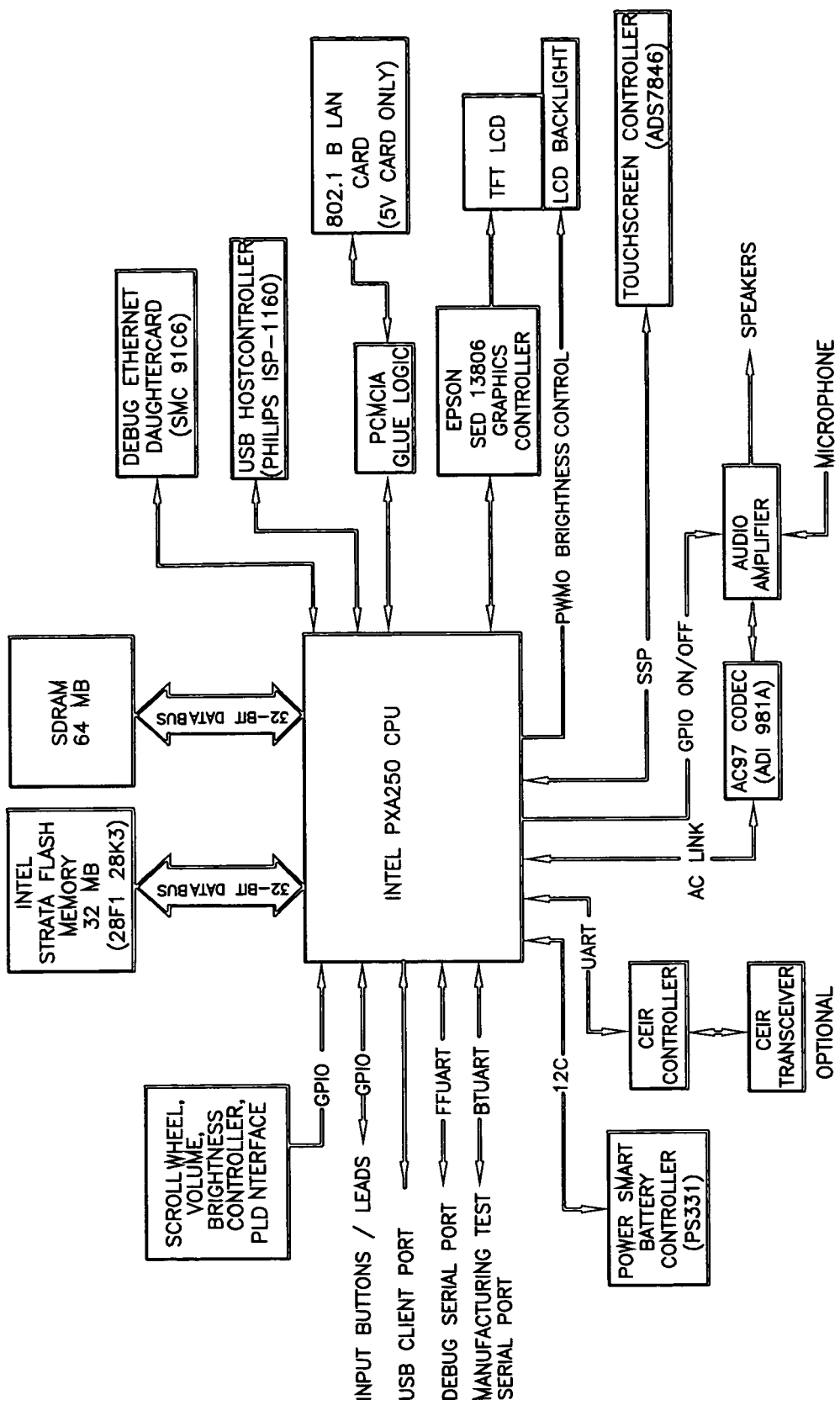
FIG. 9 is the block diagram of the Smart Device Unit core module.

FIG. 9 is a block diagram of a preferred embodiment of the Smart Device Unit core module architecture. This architecture is a Smart Display reference platform commonly used in the art, containing an Intel PXA250 400 MHz processor, and full support for the Flat Display, audio out, microphone in, USB host and client, and PCMCIA. Expansion modules are facilitated by the CardBus interface, which allows modules to be hot-swappable.

What is claimed is:

1. A portable flat display adaptor comprising: an enclosed flat display to display output signals, said flat display having mounting apparatus means; a core module external to said flat display, said core module enabling processing and controlling of inputs and outputs for said flat display; a structural means for inserting or removing said core module to said flat display using said mounting apparatus means, whereby the integrity and functionality of said flat display remains intact, and mounting apparatus means is replicated allowing for further attachment.

2. The adaptor of claim 1 wherein said core module is further attached using said replicated mounting apparatus means to a plurality of expansion modules.

3. The adaptor of claim 2 wherein said modules include a plurality of electrical interfaces, the attachment of said modules to each other activates signals and transfers power between said modules using said electrical interfaces.

4. The adaptor of claim 3 wherein said core module enables processing and controlling inputs and outputs between said flat display and said modules via said electrical interfaces.

5. The adaptor of claim 1 wherein said core module is inserted into an enclosure, said enclosure is further attached using said replicated mounting apparatus means to one or more enclosures.

6. The adaptor of claim 5 wherein one or more expansion modules is inserted into said enclosures.

7. The adaptor of claim 6 wherein said enclosures include a plurality of electrical interfaces, the attachment of said enclosures to each other activates signals and transfers power between said inserted modules using said electrical interfaces.

8. The adaptor of claim 7 wherein said core module enables processing and controlling inputs and outputs between said flat display and said inserted modules via said electrical interfaces.

9. The adaptor of claim 1 wherein said core module enables processing and controlling inputs and outputs between said flat display and unattached devices via wireless means.

10. A smart display apparatus comprising:
an enclosed flat display to display output signals, said flat display having mounting apparatus means;
a mounting apparatus for providing stationary support of said flat display via said mounting apparatus means;
one or more devices, each device including a plurality of electrical interfaces to transfer signals, said devices including means for enabling processing and controlling of inputs and outputs for said flat display;
a structural means for inserting and removing said devices in combination to said flat display, whereby the integrity and functionality of said flat display remains intact, and said mounting apparatus means is replicated allowing for further attachment;
a docking means, joined to said mounting apparatus using said structural means; said docking means allowing for insertion and removal of said devices, wherein said docking means supplies power and transfers signals to said devices attached to said flat display, and enables pass-through of signals from a standalone computer to said flat display.

11. The apparatus of claim 10, wherein said flat display joined with said devices is released from said docking means, enabling means for running remote terminal applications.

12. The apparatus of claim 10, wherein said flat display joined with said devices is released from said docking means, enabling means for running client applications in a client-server architecture.

13. The apparatus of claim 10, wherein said flat display joined with said devices is released from said docking means, enabling means for running operating system software.

14. The apparatus of claim 10, wherein said flat display joined with said devices is released from said docking means, enabling means for playing music and video.

15. The apparatus of claim 10, wherein said flat display joined with said devices is released from said docking means, enabling means for wireless communications.

16. The apparatus of claim 10, wherein said docking means has wireless means for bridging or routing of wireless network devices.

17. A method for adding smart display functions to a flat display with attached mounting apparatus, the method comprising:
an attached mode, wherein output signals from a separate standalone computer are displayed on said flat display, said flat display is attached to an external smart device module, said smart device module is inserted in a receptacle, and said receptacle is attached to said mounting apparatus;
a detached mode, wherein said external smart device module attached to said flat display is released from said receptacle, and said smart device module processes instructions and displays output signals for said flat display.

* * * * *